(12) United States Patent
Mihara

(10) Patent No.: US 10,933,503 B2
(45) Date of Patent: Mar. 2, 2021

(54) WORKPIECE GRINDING METHOD

(71) Applicant: DISCO CORPORATION, Tokyo (JP)

(72) Inventor: Takuya Mihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 407 days.

(21) Appl. No.: 16/153,077

(22) Filed: Oct. 5, 2018

(65) Prior Publication Data

US 2019/0111536 A1 Apr. 18, 2019

(30) Foreign Application Priority Data

Oct. 12, 2017 (JP) .............................. JP2017-198405

(51) Int. Cl.
*B24B 7/22* (2006.01)
*H01L 21/67* (2006.01)
*H01L 21/683* (2006.01)

(52) U.S. Cl.
CPC ........ *B24B 7/228* (2013.01); *H01L 21/67132* (2013.01); *H01L 21/6835* (2013.01); *H01L 2221/6834* (2013.01); *H01L 2221/68327* (2013.01); *H01L 2221/68386* (2013.01)

(58) Field of Classification Search
CPC ........... B24B 7/228; B24B 1/00; B24B 19/22; B24B 41/06; B24B 7/04; B24B 37/04; B24B 37/30; H01L 21/67132; H01L 21/6835; H01L 21/304; H01L 2221/68327; H01L 2221/6834; H01L 221/68386; H01L 21/6836
USPC ................ 451/29, 57–58; 438/464
See application file for complete search history.

(56) References Cited

U.S. PATENT DOCUMENTS

| | | | |
|---|---|---|---|
| 2015/0064385 A1* | 3/2015 | Flaim ...................... | B32B 37/30 428/41.3 |
| 2016/0079119 A1* | 3/2016 | Tomono .................. | H01L 21/78 438/463 |
| 2017/0110360 A1* | 4/2017 | Tagami .................. | C08G 77/04 |

(Continued)

FOREIGN PATENT DOCUMENTS

| | | | | |
|---|---|---|---|---|
| CN | 1707760 A | * | 12/2005 | ........... H01L 21/304 |
| JP | 2013187281 A | | 9/2013 | |

OTHER PUBLICATIONS

STIC search results (Year: 2020).*

*Primary Examiner* — Monica S Carter
*Assistant Examiner* — Michael A Gump
(74) *Attorney, Agent, or Firm* — Greer Burns & Crain Ltd.

(57) ABSTRACT

A workpiece grinding method including a first surface protection step of covering a front surface of a workpiece with a workpiece protective member, a second surface protection step of covering front surface of a support substrate with a support substrate protective member, a workpiece unit formation step of causing an adhesive to spread over a side surface of an outer peripheral portion of the workpiece to fix the side surface to the support substrate, and forming a workpiece unit, a grinding step of thinning the workpiece, a first peeling step of peeling off the workpiece after thinning, the workpiece protective member, the adhesive, and the support substrate protective member from the support substrate as one unit in such a manner to turn them over, and a second peeling step of peeling off the workpiece protective member, the adhesive, and the support substrate protective member as one unit from the workpiece.

5 Claims, 4 Drawing Sheets

(56) References Cited

U.S. PATENT DOCUMENTS

2017/0154802 A1* 6/2017 Yasuda ............... C09J 5/00
2019/0267245 A1* 8/2019 Suzuki ............ H01L 21/568

* cited by examiner

WORKPIECE GRINDING METHOD

BACKGROUND OF THE INVENTION

Field of the Invention

The present invention relates to a workpiece grinding method of grinding the workpiece to reduce in thickness thereof.

Description of the Related Art

There has been a grinding technique in which a semiconductor wafer and an optical device wafer using such as a sapphire or an SiC substrate are thinned with a grinding stone, but it is difficult to grind the optical device wafer due to its hardness. More specifically, even if the optical device wafer is protected with an adhesive tape for back grinding, a processing load in grinding causes the optical device wafer to sink into the adhesive tape, thereby causing of a grinding defect of the workpiece, such as breaking, cracking, chipping, or the like during grinding and thinning. To prevent this defect, there is a processing method in which an adhesive such as a wax to be cured is applied to a support substrate formed of a ceramic or a glass to fix a workpiece to the support substrate so as to prevent breakage of the workpiece, even if a grinding load is applied, since the workpiece is fixed to the hard support substrate (see, for example, Japanese Patent Laid-open No. 2013-187281).

SUMMARY OF THE INVENTION

However, when the thinned workpiece has a thickness of 100 μm or less, a warp of the workpiece occurs more greatly, an outer peripheral portion of the workpiece is separated from the support substrate during grinding, thereby causing a grinding defect of the workpiece, such as breaking, cracking, chipping, or the like. Also, in a case of using an adhesive having hardness enough that no separation of the outer peripheral portion of the workpiece occur during grinding, and strong adhesive force, a defect of the workpiece such as breaking occurs in a peeling step of peeling off the workpiece from the support substrate after grinding and thinning the workpiece.

It is therefore an object of the present invention to provide a workpiece grinding method in which separation of an outer peripheral portion of the workpiece is prevented from occurring during grinding and the workpiece can be easily peeled off from a support substrate in peeling off the thinned workpiece from the support substrate.

In accordance with an aspect of the present invention, there is provided a workpiece grinding method of grinding a back surface of a workpiece with a grinding stone, the workpiece having a front surface on which each of devices are formed in each of regions partitioned along a plurality of division lines formed in a lattice. The workpiece grinding method includes: a first surface protection step of covering the regions of the front surface of the workpiece in which the devices are formed, with a workpiece protective member; a second surface protection step of covering a front surface of a support substrate with a support substrate protective member; a workpiece unit formation step of attaching a side of the workpiece protective member which covers the regions of the front surface of the workpiece in which the devices are formed and a side of the support substrate protective member which covers the front surface of the support substrate with an adhesive, and by pressing the workpiece against the support substrate, causing the adhesive to spread over a side surface of an outer peripheral portion of the workpiece and to fix the side surface of the outer peripheral portion to the support substrate, and forming a workpiece unit; a grinding step of holding the support substrate of the workpiece unit on a holding face of a chuck table, grinding the back surface of the workpiece with a grinding stone which rotates by a rotation shaft orthogonal to the holding face, and thinning the workpiece to a flexible thickness; a first peeling step of peeling off the workpiece after the grinding step is performed, the workpiece protective member, the adhesive, and the support substrate protective member as one unit from the support substrate in such a manner to turn them over; and a second peeling step of peeling off the workpiece protective member, the adhesive, and the support substrate protective member as one unit from the workpiece, after the first peeling step is performed. The side surface of the outer peripheral portion of the workpiece is supported with the adhesive to prevent the outer peripheral portion of the workpiece from peeling off from the support substrate due to a warp of the workpiece.

It is preferable that the workpiece protective member and the support substrate protective member be adhesive tapes. Also, it is preferable that the adhesive be a liquid resin which is cured by heating or ultraviolet (UV) irradiation.

It is preferable that the workpiece be a sapphire wafer. Also, it is preferable that a thickness of the workpiece after the grinding step is performed be 100 μm or less.

According to the workpiece grinding method of the present invention, during grinding the workpiece, the side surface of the outer peripheral portion of the workpiece is strongly fixed to the support substrate with the adhesive, so that the outer peripheral portion of the workpiece can be prevented from peeling off from the support substrate, and a grinding defect such as breaking, cracking, or chipping of the workpiece can be prevented from occurring.

In addition, according to the present invention, since the adhesive only fixes the side surface of the outer peripheral portion of the workpiece and the adhesive is not in contact with the front surface of the support substrate and the front surface of the workpiece, it is possible to easily peel off the support substrate protective member from the support substrate in the first peeling step, and to easily peel off the workpiece protective member from the front surface of the workpiece in the second peeling step.

In a case where the workpiece protective member and the support substrate protective member are each formed of an adhesive tape, it is possible to easily perform the first peeling step and the second peeling step. Also, in a case where the adhesive is formed of a liquid resin which is cured by heating or a UV irradiation, it is possible to cause the adhesive to efficiently spread over the side surface of the outer peripheral portion of the workpiece in performing the workpiece unit formation step.

In a case where the workpiece is a sapphire wafer, a warp of the outer peripheral portion after thinning tends to become great. According to the present invention, however, since the side surface of the outer peripheral portion of the workpiece is strongly fixed to the support substrate with the adhesive, it is possible to favorably grind even a workpiece of a hard material. Moreover, in a case where a thickness of the workpiece after the grinding step is performed is set to 100 μm or less, a warp of the outer peripheral portion after thinning is likely to occur. However, according to the present invention, it is possible to grind the workpiece to a desired thickness while preventing the warp of the outer peripheral portion after thinning.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
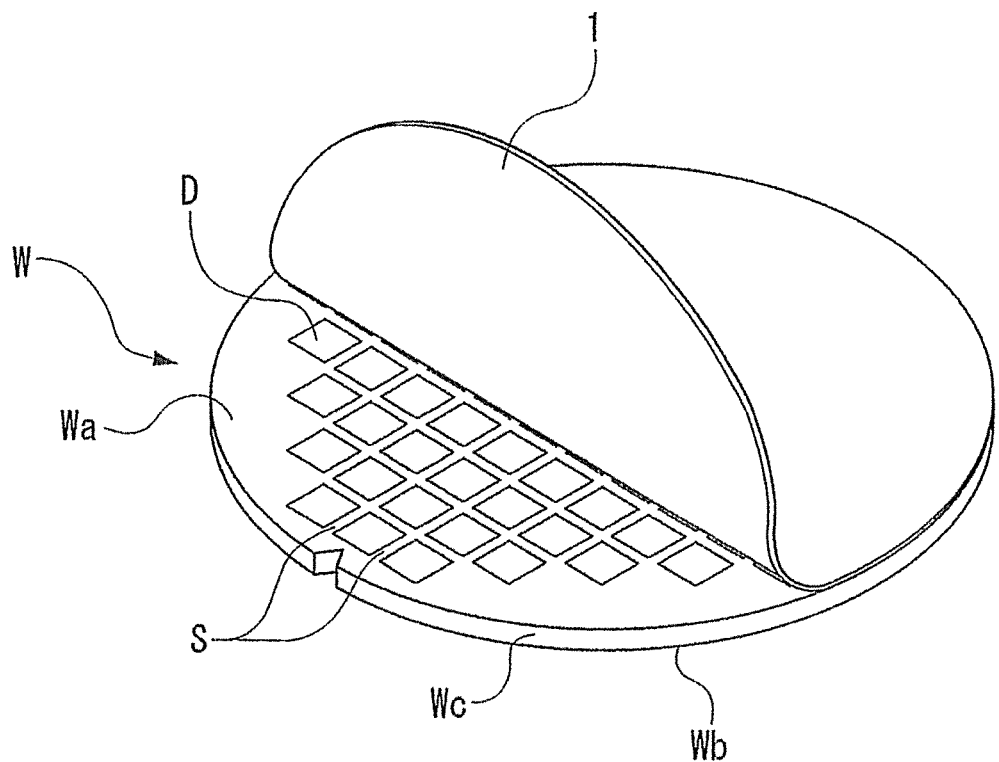
FIG. 1 is a perspective view illustrating a first surface protection step.

A workpiece W illustrated in FIG. 1 is provided with a substrate in a circular-plate shape and has a front surface Wa in which each of devices D are formed in each of regions partitioned along a plurality of division lines S formed in a lattice. A back surface Wb opposite to the front surface Wa of the workpiece W is a surface to be processed by grinding with a grinding stone, for example. The workpiece W illustrated in the present embodiment is formed of a sapphire wafer, for example. A thickness of the workpiece W before grinding is, although not particularly limited, 700 μm, for example. A workpiece grinding method of grinding the back surface Wb of the workpiece W will be described below.

(1) First Surface Protection Step

As illustrated in FIG. 1, each of the regions of the front surface Wa of the workpiece W in which each of the devices D is formed is covered with a workpiece protective member 1. The workpiece protective member 1 illustrated in the present embodiment has an adhesive property and substantially the same size in diameter as the workpiece W. Also, the workpiece protective member 1 is an adhesive tape in which a sticking layer (adhesive layer) is laminated over a base material including polyolefin or polyvinyl chloride, for example. By attaching the workpiece protective member 1 to the front surface Wa of the workpiece W to cover the entire front surface Wa, each of the devices D is protected.

(2) Second Surface Protection Step

Figure 2:
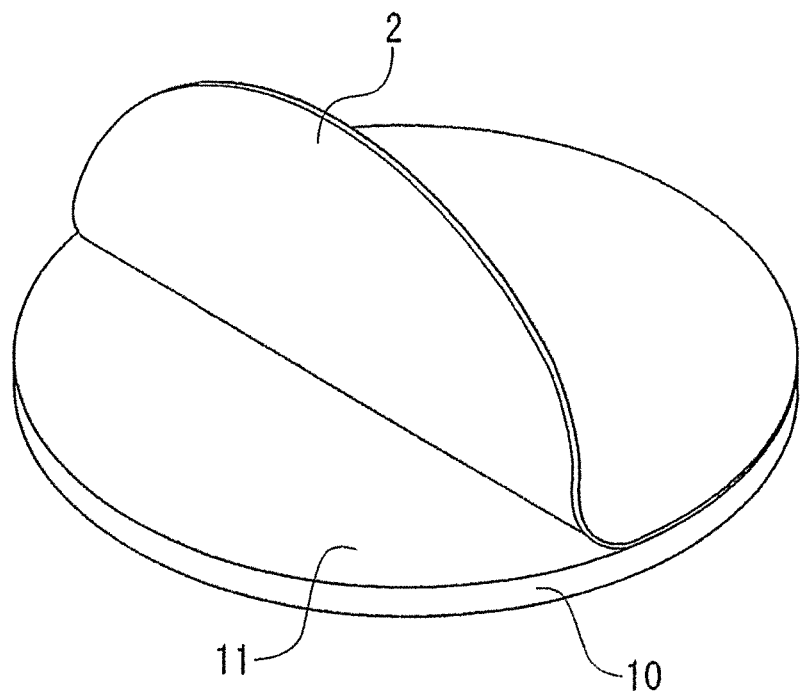
FIG. 2 is a perspective view illustrating a second surface protection step.

As illustrated in FIG. 2, a front surface 11 of a support substrate 10 is covered with a support substrate protective member 2. The support substrate 10 is a support substrate for supporting the workpiece W for reinforcement during grinding and formed of a glass or a ceramic, for example. The support substrate protective member 2 is formed of an adhesive tape similar to the workpiece protective member 1, although not particularly limited. By attaching the support substrate protective member 2 to the front surface 11 of the support substrate 10 to cover the entire front surface 11, the front surface 11 is protected. Note that the support substrate 10 and the support substrate protective member 2 have diameters larger than an outer diameter of the workpiece W.

In the present embodiment, the first surface protection step is performed before the second surface protection step is performed, but it is not limited to this case. For example, the first surface protection step and the second surface protection step may be performed at the same time. Alternatively, the second surface protection step may be performed before first surface protection step is performed.

(3) Workpiece Unit Formation Step

Figure 3A:
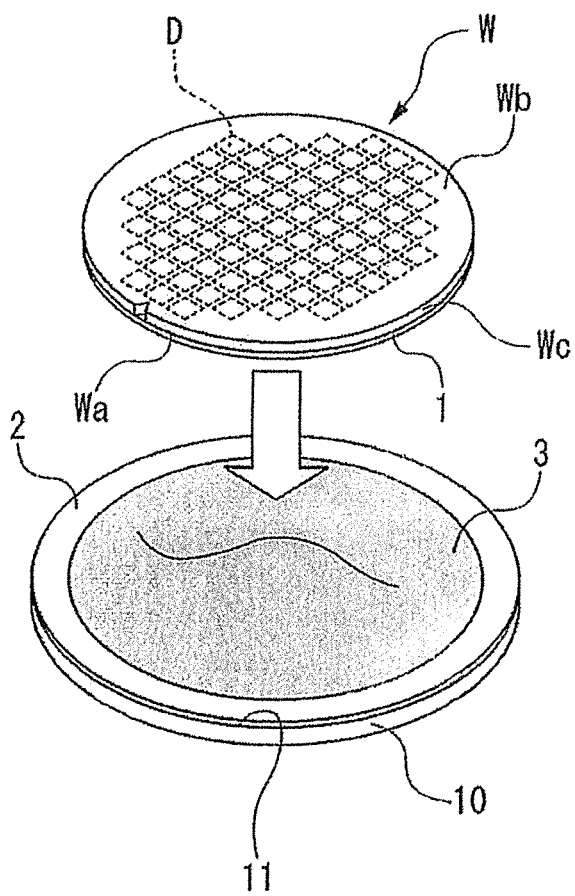
FIG. 3A is a perspective view illustrating a workpiece unit formation step.
Figure 3B:
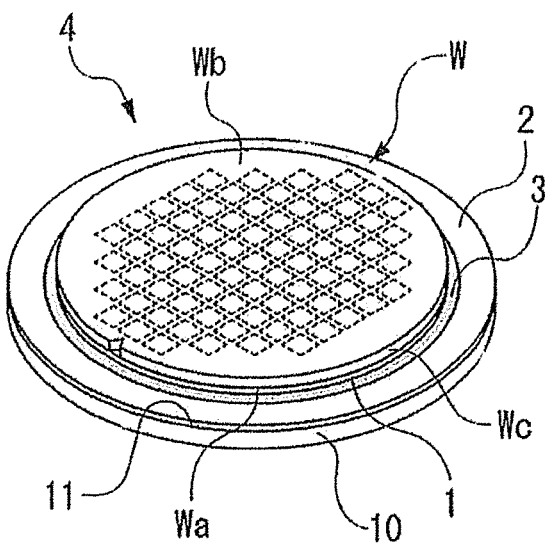
FIG. 3B is a perspective view illustrating a configuration of a workpiece unit.

As illustrated in FIG. 3A and FIG. 3B, the workpiece W and the support substrate 10 are adhered and fixed with an adhesive 3. The adhesive 3 is preferably made of a liquid resin which is cured by heating or UV irradiation. In an example illustrated in FIG. 3A, the adhesive 3 before curing may be in advance applied onto the support substrate protective member 2 attached to the front surface 11 of the support substrate 10.

Also, in order to prevent separation of the workpiece W and the support substrate 10 during grinding of the workpiece W to be described later, it is preferred to select a resin having much greater hardness and much higher viscosity for the adhesive 3 to be used. The adhesive 3 illustrated in the present embodiment is assumed to be composed of a product by TESK CO., LTD (part number: B-1014B), for example. The adhesive 3 mentioned above is an epoxy resin having a thermosetting property which is cured through a heat treatment at 100° C. or more.

As illustrated in FIG. 3A, the workpiece W is arranged upside down in such a manner that the front surface Wa of the workpiece W faces downward, and accordingly, a side of the workpiece protective member 1 which covers the regions of the front surface Wa of the workpiece W in which the devices D are formed faces a side of the support substrate protective member 2 which covers the front surface 11 of the support substrate 10. Then, the workpiece W is moved in a direction of approaching the adhesive 3 applied onto the support substrate 10. Subsequently, as illustrated in FIG. 3B, the workpiece W is pushed against the adhesive 3 to attach the side the workpiece protective member 1 and the side of the support substrate protective member 2 with the adhesive 3.

Figure 4:
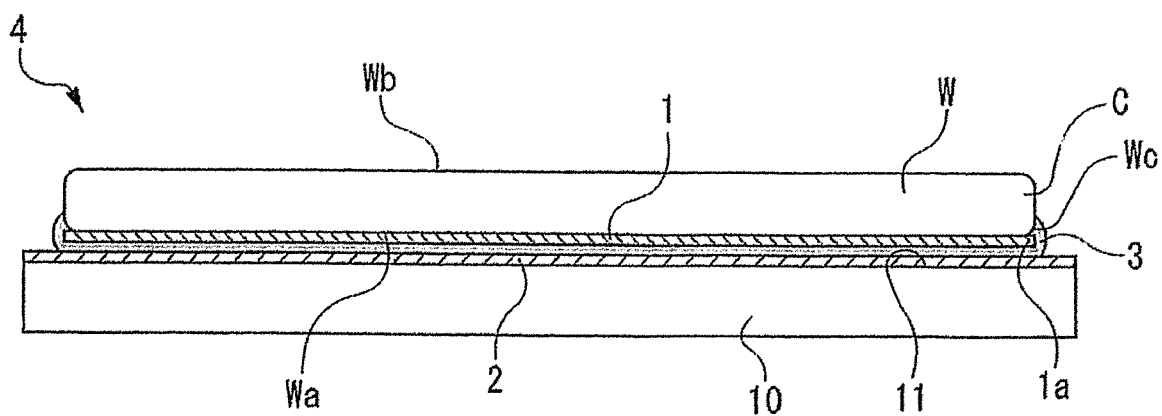
FIG. 4 is a sectional view illustrating the configuration of the workpiece unit.

In this case, by pushing the workpiece W downward, the adhesive 3 extends outward in a radial direction, and as illustrated in FIG. 4, the adhesive 3 is caused to protrude outward between an outer peripheral portion 1a of the workpiece protective member 1 and an outer peripheral side of the support substrate protective member 2 and spread over a side surface Wc of an outer peripheral portion C of the workpiece W to cover the side surface Wc. The adhesive 3 before curing is in a liquid state, so that pressing the workpiece W can make the adhesive 3 spread over the side surface Wc of the outer peripheral portion C efficiently. In this state, for example, the adhesive 3 is subjected to heating at, for example, 100° C. or more, by use of heating means such as a heater, thereby curing the adhesive 3. As a result of curing the adhesive 3, the workpiece W and the support substrate 10 can be fixed to form a workpiece unit 4. Of the workpiece unit 4, the side surface Wc of the outer peripheral portion C of the workpiece W is strongly fixed to the support substrate 10 by the cured adhesive 3, and the outer peripheral portion C of the workpiece W is in a state of being hard to separate from the support substrate 10. In a case where the adhesive 3 is formed of a UV curable resin, for example, an external stimulus such as UV irradiation is applied to the adhesive 3 by use of a UV lamp, thereby curing the adhesive 3.

(4) Grinding Step

Figure 5:
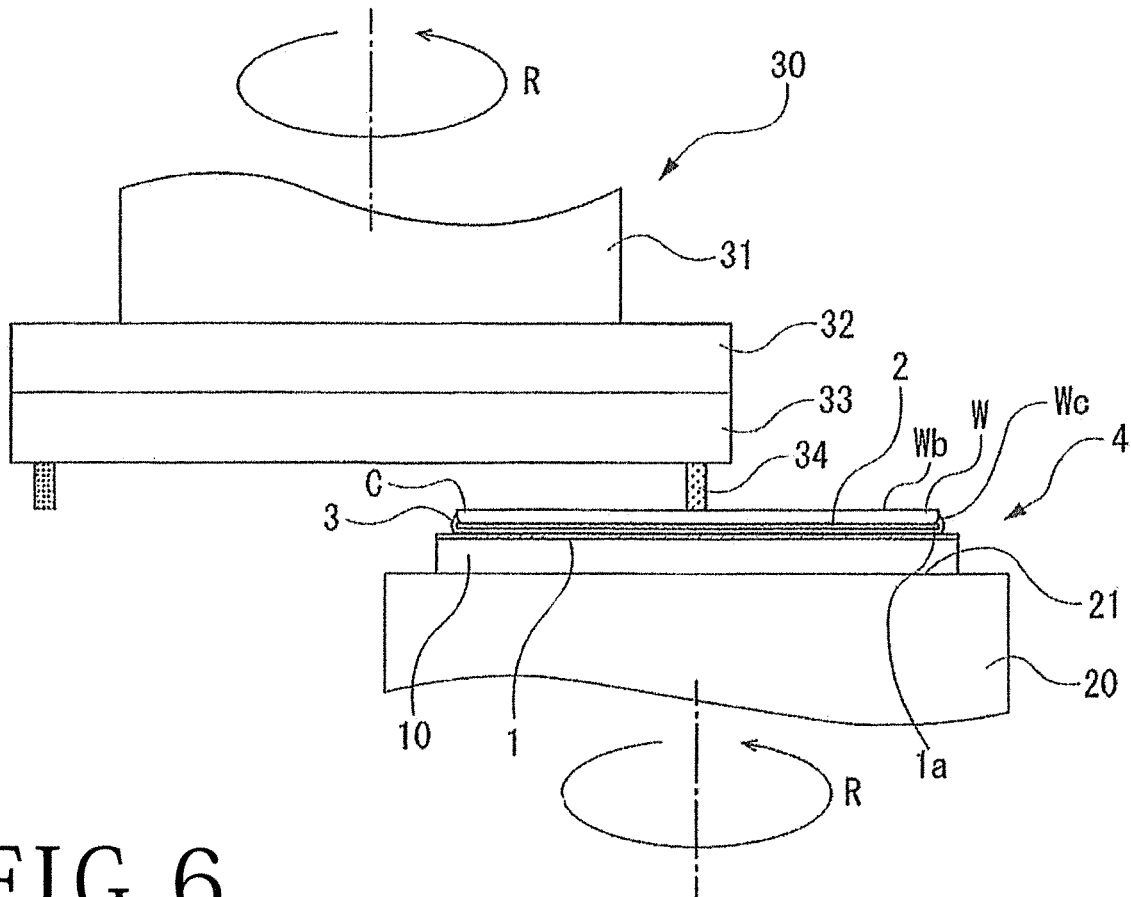
FIG. 5 is a sectional view illustrating a grinding step.

After performing the workpiece unit formation step, as illustrated in FIG. 5, the workpiece unit 4 is held on a holding face 21 of a chuck table 20, and grinding means 30 disposed on an upper side of the chuck table 20 grinds the back surface Wb of the workpiece W. The grinding means 30 includes a rotation shaft 31 having a shaft center extending in a vertical direction orthogonal to the holding face 21, a grinding wheel 33 mounted to a lower end of the rotation shaft 31 through a mount 32, and a grinding stone 34 fixedly attached to a lower portion of the grinding wheel 33 in a ring shape. The grinding means 30 has lifting means (not illustrated) connected thereto, and the lifting means can entirely lift the grinding means 30 up and down in the vertical direction while rotating the grinding wheel 33.

Figure 6:
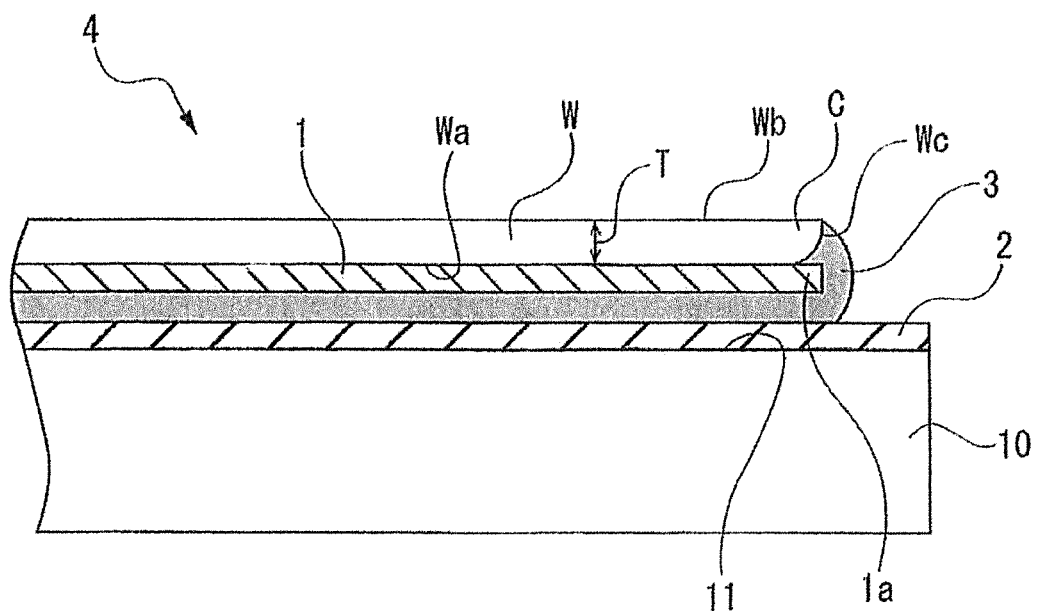
FIG. 6 is a partial enlarged sectional view illustrating the workpiece unit in a state where the workpiece unit is thinned after being subjected to grinding.

In a case of grinding the workpiece W, a side of the support substrate 10 of the workpiece unit 4 is held on the holding face 21 of the chuck table 20 such that the back surface Wb of the workpiece W is exposed upward, and the chuck table 20 is rotated, for example, in a direction of an arrow R. Subsequently, the grinding means 30 lowers the grinding wheel 33 at a predetermined grinding feeding speed while rotating the grinding wheel 33 in the direction of the arrow R, for example, and while pressing the back surface Wb of the workpiece W with the grinding stone 34 which rotates, grinds and thins the back surface Wb of the workpiece W so as to reach a flexible thickness T illustrated in FIG. 6. The flexible thickness T illustrated in the present embodiment is a thickness in which a warp occurs in the outer peripheral portion C of the workpiece W, while at the same time, meaning a predetermined finished thickness. The flexible thickness T is preferably set to 100 μm or less, for example, and is assumed to set to 50 μm or less, for example, in the present embodiment.

During grinding the workpiece W, when the thickness of the workpiece W is thinned to 100 μm or less, the workpiece W is curved in a direction (upward direction) in which the outer peripheral portion C of the workpiece W is separated from the support substrate 10, and a warp is likely to occur. However, since the side surface We of the outer peripheral portion C of the workpiece W is strongly fixed to the support substrate 10 with the adhesive 3, it is possible to prevent the warp of the outer peripheral portion C from occurring, so that separation of the outer peripheral portion C from the support substrate 10 during grinding can be prevented. Then, at the time of thinning the workpiece W to the flexible thickness T by the grinding operation, the grinding step ends.

(5) First Peeling Step

Figure 7:
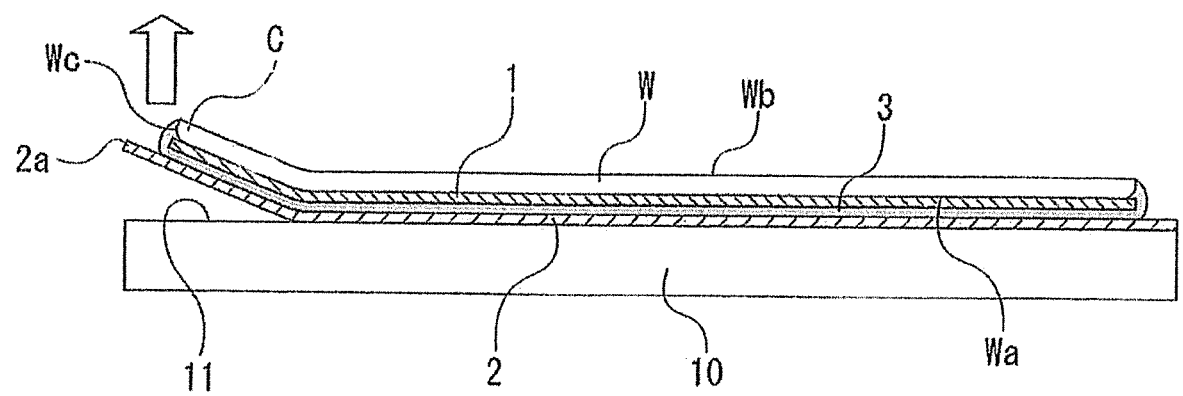
FIG. 7 is a sectional view illustrating a first peeling step.

After the grinding step is performed, as illustrated in FIG. 7, for example, a peeling tape having higher adhesive force than the support substrate protective member 2 is attached to an outer peripheral edge portion 2a of the support substrate protective member 2 adhered to the support substrate 10 and projecting outward from the side surface We of the outer peripheral portion C of the workpiece W to pull the peeling tape up, and accordingly, the workpiece W, the workpiece protective member 1, the adhesive 3, and the support substrate protective member 2 are peeled off from the support substrate 10 as one unit in such a manner to turn them over. In this manner, it is possible to easily separate the support substrate protective member 2 from the front surface 11 of the support substrate 10 and to lift up the side of the outer peripheral portion C of the workpiece W. Thus, by separating the support substrate protective member from the entire front surface 11 of the support substrate 10, the workpiece W is fully peeled off from the support substrate 10.

(6) Second Peeling Step

Figure 8:
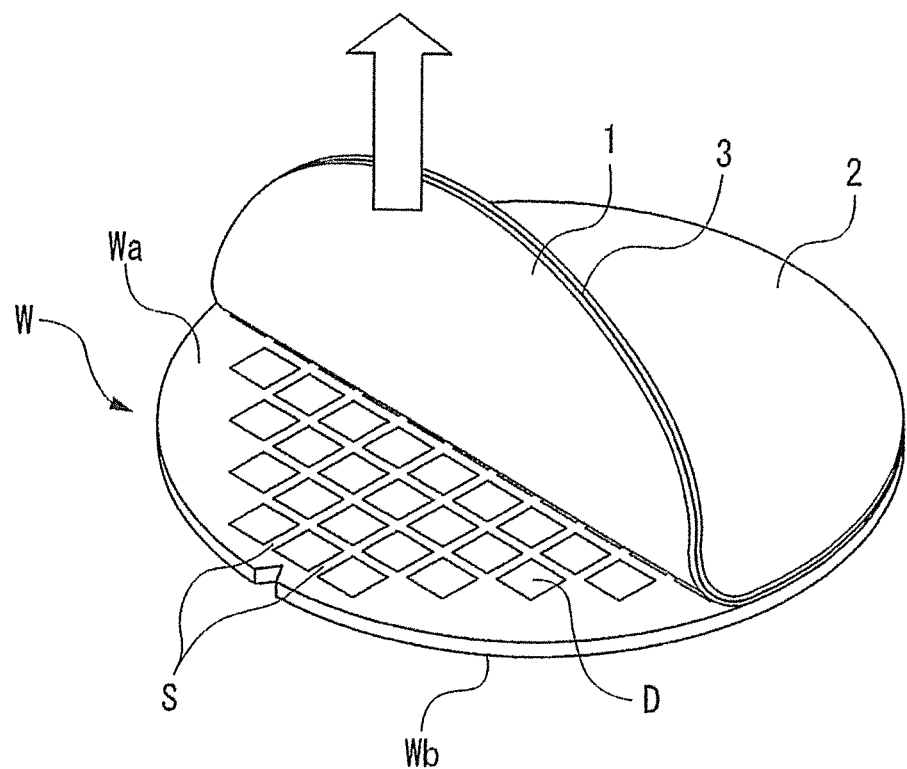
FIG. 8 is a perspective view illustrating a second peeling step.

After the first peeling step is performed, as illustrated in FIG. 8, the workpiece W is reversed, so that the front surface Wa of the workpiece W faces upward. A peeling operation in the second peeling step may be carried out in an operation similar to the first peeling step. More specifically, for example, a peeling tape having higher adhesive force than the workpiece protective member 1 is attached to the outer peripheral edge portion 2a of the support substrate protective member 2 to pull the peeling tape up, and accordingly, the workpiece protective member 1, the adhesive 3, and the support substrate protective member 2 are peeled off from the front surface Wa of the workpiece W as one unit in such a manner to turn them over. At this time, since only the workpiece protective member 1 is attached to the surface Wa of the workpiece W, it is possible to easily separate the workpiece protective member 1 from the surface Wa of the workpiece W. Thus, by separating the workpiece protective member 1 from the entire front surface Wa of the workpiece W, the entire front surface Wa of the workpiece W can be exposed. In this manner, the workpiece W having favorable processing accuracy can be obtained.

As described above, the workpiece grinding method according to the present invention includes the first surface protection step of covering the regions of the front surface Wa of the workpiece W in which the devices D are formed, with the workpiece protective member 1, the second surface protection step of covering the front surface 11 of the support substrate 10 with the support substrate protective member 2, the workpiece unit formation step of attaching the side of the workpiece protective member 1 which covers the regions of the front surface Wa of the workpiece W in which the devices D are formed and the side of the support substrate protective member 2 which covers the front surface 11 of the support substrate 10 with the adhesive 3, and by pressing the workpiece W against the support substrate 10, causing the adhesive 3 to spread over the side surface Wc of the outer peripheral portion C of the workpiece W and to fix the side surface Wc of the outer peripheral portion C of the workpiece W to the support substrate 10, and forming the workpiece unit 4, the grinding step of thinning the workpiece W to the flexible thickness T, the first peeling step of peeling off the workpiece W after thinning, the workpiece protective member 1, the adhesive 3, and the support substrate protective member 2 as one unit from the support substrate 10 in such a manner to turn them over, and the second peeling step of peeling off the workpiece protective member 1, the adhesive 3, and the support substrate protective member 2 as one unit from the workpiece W. Accordingly, the side surface Wc of the outer peripheral portion C of the workpiece W is strongly fixed to the support substrate 10 with the adhesive 3 during grinding of the workpiece W. As a result, the outer peripheral portion C of the workpiece W can be prevented from peeling off from the support substrate 10, and a grinding defect such as breaking, cracking, or chipping of the workpiece W can be prevented from occurring.

In addition, in the present invention, the side surface We of the outer peripheral portion C of the workpiece W is only fixed with the adhesive 3, and the adhesive 3 is not in contact with the front surface 11 of the support substrate 10 and the front surface Wa of the workpiece W. Accordingly, the support substrate protective member 2 can be easily peeled off from the support substrate 10 in the first peeling step, and the workpiece protective member 1 can be easily peeled off from the front surface Wa of the workpiece W in the second peeling step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece grinding method of grinding a back surface of a workpiece with a grinding stone, the workpiece having a front surface on which each of devices is formed in each of regions partitioned along a plurality of division lines formed in a lattice, the method comprising:
 a first surface protection step of covering the regions of the front surface of the workpiece in which the devices are formed, with a workpiece protective member;
 a second surface protection step of covering a front surface of a support substrate with a support substrate protective member;
 a workpiece unit formation step of attaching a side of the workpiece protective member which covers the regions of the front surface of the workpiece in which the devices are formed and a side of the support substrate protective member which covers the front surface of the support substrate with an adhesive, and by pressing the workpiece against the support substrate, causing the adhesive to spread over a side surface of an outer peripheral portion of the workpiece and to fix the side surface of the outer peripheral portion to the support substrate, and forming a workpiece unit;
 a grinding step of holding the support substrate of the workpiece unit on a holding face of a chuck table, grinding the back surface of the workpiece with the grinding stone which rotates by a rotation shaft orthogonal to the holding face, and thinning the workpiece to a flexible thickness;
 a first peeling step of peeling off the workpiece after the grinding step is performed, the workpiece protective member, the adhesive, and the support substrate protective member as one unit from the support substrate in such a manner to turn them over; and
 a second peeling step of peeling off the workpiece protective member, the adhesive, and the support substrate protective member as one unit from the workpiece, after the first peeling step is performed,
 wherein the side surface of the outer peripheral portion of the workpiece is supported with the adhesive to prevent the outer peripheral portion of the workpiece from peeling off from the support substrate due to a warp of the workpiece.

2. The workpiece grinding method according to claim 1, wherein the workpiece protective member and the support substrate protective member are adhesive tapes.

3. The workpiece grinding method according to claim 1, wherein the adhesive is a liquid resin which is cured by heating or ultraviolet irradiation.

4. The workpiece grinding method according to claim 1, wherein the workpiece is a sapphire wafer.

5. The workpiece grinding method according to claim 4, wherein a thickness of the workpiece after the grinding step is performed is 100 μm or less.

* * * * *